(12) United States Patent
Yoon

(10) Patent No.: US 12,476,112 B2
(45) Date of Patent: Nov. 18, 2025

(54) METHOD FOR FABRICATING A SEMICONDUCTOR DEVICE INCLUDING A MOS TRANSISTOR HAVING A SILICIDE LAYER

(71) Applicant: SK hynix Inc., Gyeonggi-do (KR)

(72) Inventor: Young Gwang Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/674,923

(22) Filed: May 27, 2024

(65) Prior Publication Data

US 2024/0312784 A1    Sep. 19, 2024

Related U.S. Application Data

(63) Continuation of application No. 17/534,252, filed on Nov. 23, 2021, now Pat. No. 12,033,858.

(30) Foreign Application Priority Data

Jun. 24, 2021 (KR) .................. 10-2021-0082117

(51) Int. Cl.
H01L 21/28 (2025.01)
H10D 30/60 (2025.01)
H10D 64/27 (2025.01)
H10D 64/66 (2025.01)
H10D 64/68 (2025.01)
H10D 84/01 (2025.01)
H10D 84/03 (2025.01)

(52) U.S. Cl.
CPC .. *H01L 21/28097* (2013.01); *H01L 21/28088* (2013.01); *H10D 30/601* (2025.01); *H10D 64/517* (2025.01); *H10D 64/667* (2025.01); *H10D 64/668* (2025.01); *H10D 64/689* (2025.01); *H10D 64/691* (2025.01); *H10D 84/0137* (2025.01); *H10D 84/038* (2025.01)

(58) Field of Classification Search
CPC .. H10D 64/662; H10D 64/664; H10D 64/663; H10D 64/691; H01L 21/28097; H01L 21/823443; H01L 21/28088; H01L 29/42372; H01L 29/401; H01L 29/4975
See application file for complete search history.

(56) References Cited

U.S. PATENT DOCUMENTS

| | | | | |
|---|---|---|---|---|
| 7,282,443 B2 * | 10/2007 | Hu | ................... | H01L 21/28061 |
| | | | | 257/E21.199 |
| 8,159,035 B2 * | 4/2012 | Chao | ................... | H10D 64/668 |
| | | | | 257/407 |
| 9,034,749 B2 * | 5/2015 | Breil | ..................... | H10D 64/66 |
| | | | | 438/303 |

* cited by examiner

Primary Examiner — Jose R Diaz
(74) Attorney, Agent, or Firm — IP & T GROUP LLP

(57) ABSTRACT

A method for fabricating a MOS transistor includes: forming a gate dielectric material layer over a substrate; forming a lower gate electrode material layer over the gate dielectric material layer; performing a first ion bombardment process of bombarding the lower gate electrode material layer with first ions; forming an intermediate gate electrode material layer including an amorphous silicon layer over the lower gate electrode material layer; forming an upper gate electrode material layer over the intermediate gate electrode material layer; performing a second ion bombardment process for bombarding the upper gate electrode material layer with second ions; and forming silicide layers in the lower gate electrode material layer and the upper gate electrode material layer to form a lower gate electrode layer and an upper gate electrode layer.

15 Claims, 15 Drawing Sheets

10

10

METHOD FOR FABRICATING A SEMICONDUCTOR DEVICE INCLUDING A MOS TRANSISTOR HAVING A SILICIDE LAYER

CROSS-REFERENCE TO RELATED APPLICATIONS

This application is a continuation of U.S. patent application Ser. No. 17/534,252 filed on Nov. 23, 2021, which claims priority of Korean Patent Application No. 10-2021-0082117, filed on Jun. 24, 2021, which is incorporated herein by reference in its entirety.

BACKGROUND

1. Field

Embodiments of the present disclosure relate to semiconductor devices including MOS transistors of diverse structures having a silicide layer, and a method for fabricating the semiconductor devices including MOS transistors.

2. Description of the Related Art

Highly integrated semiconductor devices are being researched and developed. A highly integrated semiconductor device includes a high-k gate dielectric layer or a ferroelectric gate dielectric layer. In a process of fabricating semiconductor devices, the gate dielectric layers may be subjected to excessive stress so that their phase may change and their characteristics may deteriorate, which is problematic.

SUMMARY

Embodiments of the present disclosure are directed to a MOS transistor structure having a silicide layer.

Embodiments of the present disclosure are directed to a method for forming a MOS transistor having a silicide layer.

Embodiments of the present disclosure are directed to a semiconductor device and system including a MOS transistor structure having a silicide layer.

Embodiments of the present disclosure are directed to a method for fabricating a semiconductor device including a MOS transistor structure having a silicide layer.

The objectives of the present disclosure are not limited to the above-mentioned objectives, and it is obvious to those skilled in the art that there may be other objectives that are not mentioned above.

In accordance with an embodiment of the present disclosure, a method for fabricating a MOS transistor includes: forming a gate dielectric material layer over a substrate; forming a lower gate electrode material layer over the gate dielectric material layer; performing a first ion bombardment process of bombarding the lower gate electrode material layer with first ions; forming an intermediate gate electrode material layer including an amorphous silicon layer over the lower gate electrode material layer; forming an upper gate electrode material layer over the intermediate gate electrode material layer; performing a second ion bombardment process for bombarding the upper gate electrode material layer with second ions; and forming silicide layers in the lower gate electrode material layer and the upper gate electrode material layer to form a lower gate electrode layer and an upper gate electrode layer.

In accordance with another embodiment of the present disclosure, a method for forming a MOS transistor includes: forming a gate dielectric material layer over a substrate; forming a base gate electrode material layer over the gate dielectric material layer; forming a lower gate electrode material layer over the base gate electrode material layer; forming an intermediate gate electrode material layer over the lower gate electrode material layer; forming an upper gate electrode material layer over the intermediate gate electrode material layer; and forming silicide layers in an upper region of the lower gate electrode material layer and the upper gate electrode material layer to form a lower gate electrode layer and an upper gate electrode layer.

In accordance with yet another embodiment of the present disclosure, a MOS transistor includes: a gate stack disposed over a substrate; a gate spacer disposed on a side surface of the gate stack; and source/drain regions formed in the substrate to be vertically aligned with the gate stack or the gate spacers; wherein the gate stack includes: a gate dielectric layer; a lower gate electrode layer over the gate dielectric layer; an upper gate electrode layer over the lower gate electrode layer; and a gate capping layer over the upper gate electrode layer, and the lower gate electrode layer includes a first silicide layer, and the upper gate electrode layer includes a second silicide layer.

In accordance with another embodiment of the present disclosure, a method for fabricating a MOS transistor, includes: forming a gate dielectric material layer on a substrate; forming a barrier material layer on the gate dielectric material layer; forming a lower gate electrode material layer on the barrier material layer; and performing a first ion bombardment process of bombarding the lower gate electrode material layer with first ions to form lower vacancies in a portion of the lower gate electrode material layer.

DETAILED DESCRIPTION

Various embodiments of the present disclosure will be described below in more detail with reference to the accompanying drawings. The present invention may, however, be embodied in different forms and should not be construed as limited to the embodiments set forth herein. Rather, these embodiments are provided to make this disclosure thorough and complete, and fully convey the scope of the present disclosure to those skilled in the art. The spirit and scope of the invention are as defined in the claims.

When a first layer is referred to as being "on" a second layer or "on" a substrate, it not only refers to a case where the first layer is formed directly on the second layer or the substrate but also a case where a third layer exists between the first layer and the second layer or the substrate. The drawings are not necessarily to scale and, in some instances, proportions may have been exaggerated in order to clearly illustrate features of the embodiments.

FIGS. 1A to 1H are longitudinal cross-sectional views illustrating MOS transistors of a semiconductor device in accordance with embodiments of the present disclosure.

Figure 1A:
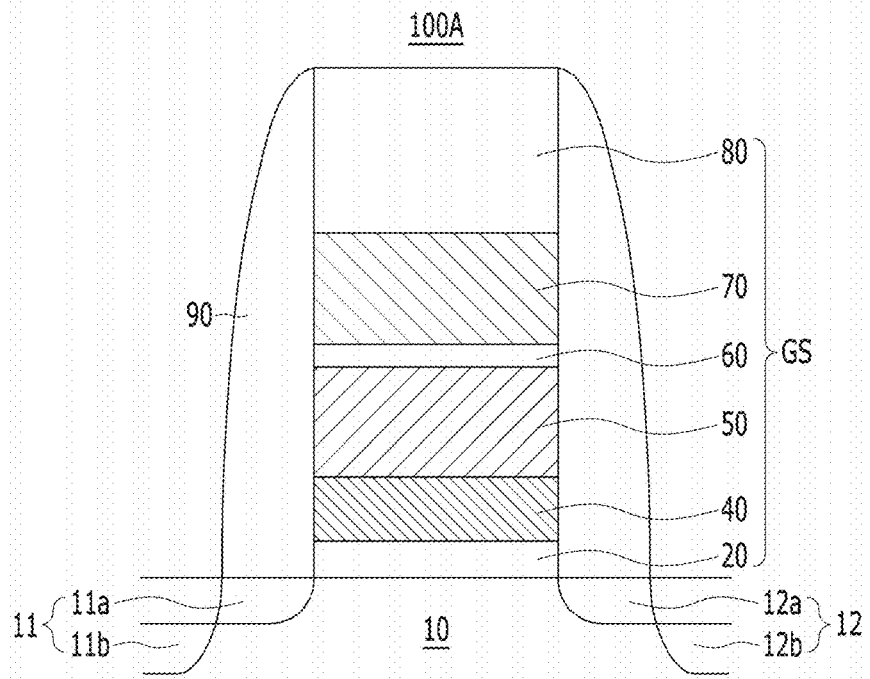
FIGS. 1A to 1H are longitudinal cross-sectional views illustrating MOS transistors of a semiconductor device in accordance with embodiments of the present disclosure.

Referring to FIG. 1A, a MOS transistor 100A of a semiconductor device in accordance with an embodiment of the present disclosure may include a gate stack GS formed over a substrate 10. The MOS transistor 100A may further include a first source/drain region 11 formed in the substrate 10, a second source/drain region 12 formed in the substrate 10 on both sides of the gate stack GS. The MOS transistor 100A may further include spacers 90 formed over the substrate 10 on both sides of the gate stack GS. The gate stack GS may include a gate dielectric layer 20, a base gate electrode layer 40, a lower gate electrode layer 50, an intermediate gate electrode layer 60, an upper gate electrode layer 70, and a gate capping layer 80.

The substrate 10 may include a semiconductor substrate. The substrate 10 may include, for example, a monocrystalline silicon layer, a silicon-on-insulator (SOI), an epitaxially grown silicon layer, or a compound semiconductor layer.

The gate dielectric layer 20 may include a ferroelectric material. For example, the gate dielectric layer 20 may include one among metal oxides, such as hafnium oxide ($HfO_x$), zirconium oxide ($ZrO_x$), and hafnium zirconium oxide ($HfZrO_x$). According to another embodiment of the present disclosure, the gate dielectric layer 20 may further include one or more among aluminum (Al), yttrium (Y), lanthanum (La), gadolinium (Gd), and strontium (Sr).

The base gate electrode layer 40 may include one or more among metal compounds and alloys, such as titanium nitride (TiN), tantalum nitride (TaN), titanium aluminum alloy (TiAl), titanium carbide (TiC), and tungsten nitride (WN).

The lower gate electrode layer 50 may include one or more among silicidable metals and silicidable metal nitrides, such as cobalt (Co), nickel (Ni), hafnium (Hf), molybdenum (Mo), titanium (Ti), aluminum (Al), tantalum (Ta) and tungsten (W), and titanium nitride (TiN). The lower gate electrode layer 50 may partially or entirely include a silicide layer. For example, the lower gate electrode layer 50 may include a metal silicide including at least one of titanium silicide (TiSi), aluminum silicide (AlSi), tantalum silicide (TaSi), tungsten silicide (WSi), cobalt silicide (CoSi), nickel silicide (NiSi), titanium nitride silicide (TiNSi), titanium aluminum silicide (TiAlSi), titanium carbon silicide (TiCSi), tantalum nitride silicide (TaNSi), and other metal-silicon compounds. The lower gate electrode layer 50 may include a relatively metal-rich lower silicide region and a relatively silicon-rich upper silicide region.

The intermediate gate electrode layer 60 may include a silicon layer. For example, the intermediate gate electrode layer 60 may include a polycrystalline silicon doped with N-type ions, such as arsenic (As), antimony (Sb), and phosphorus (P), or P-type ions, such as boron (B), boron fluoride ($BF_2$), gallium (Ga), and indium (In).

The upper gate electrode layer 70 may include one or more among a metal, a metal compound, or an alloy thereof. A metal, for example, may include titanium (Ti), aluminum (Al), tantalum (Ta), or tungsten (W). A metal compound, for example, may include titanium nitride (TiN), aluminum nitride (AlN), tantalum nitride (TaN), or tungsten nitride (WN). The upper gate electrode layer 70 may partially or entirely include a silicide layer. For example, the upper gate electrode layer 70 may include a metal silicide including at least one of titanium silicide (TiSi), aluminum silicide (AlSi), tantalum silicide (TaSi), tungsten silicide (WSi), cobalt silicide (CoSi), nickel silicide (NiSi), and other metal-silicon compounds. The upper gate electrode layer 70 may include a relatively silicon-rich lower silicide region and a relatively metal-rich upper silicide region.

The gate capping layer 80 may include a dielectric material such as silicon nitride.

Sides of the gate stack GS may be vertically aligned. For example, both sides of the gate dielectric layer 20, the base gate electrode layer 40, the lower gate electrode layer 50, the intermediate gate electrode layer 60, the upper gate electrode layer 70, and the gate capping layer 80 may be vertically aligned.

The first source/drain region 11 may include a first shallow source/drain region 11a and a first deep source/drain region 11b. The first shallow source/drain region 11a and the first deep source/drain region 11b may partially overlap with each other.

The second source/drain region 12 may include a second shallow source/drain region 12a and a second deep source/drain region 12b. The second shallow source/drain region 12a and the second deep source/drain region 12b may partially overlap with each other.

The first source/drain region 11 and the second source/drain region 12 may include N-type ions, such as arsenic (As), antimony (Sb), and phosphorus (P), or P-type ions, such as boron (B), boron fluoride ($BF_2$), gallium (Ga) and indium (In).

The side ends of the first shallow source/drain region 11a and the second shallow source/drain region 12a may be aligned with the side of the gate stack GS. The side ends of the first deep source/drain region 11b and the second deep source/drain region 12b may be aligned with the side of the spacers 90.

Figure 1B:
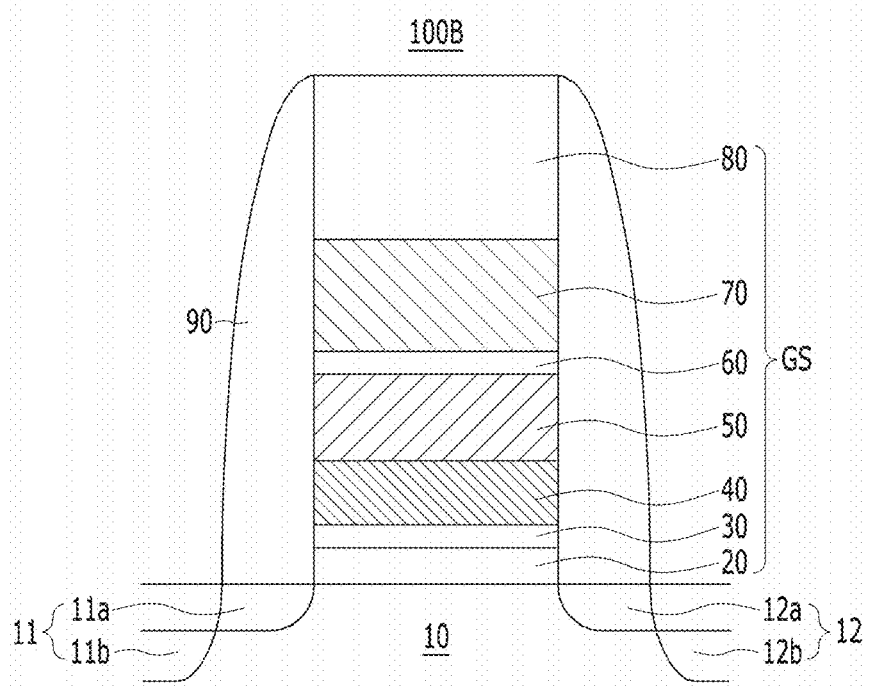

Referring to FIG. 1B, a MOS transistor 100B of the semiconductor device in accordance with an embodiment of the present disclosure may include a gate stack GS formed over a substrate 10, a first source/drain region 11 and a second source/drain region 12 formed in the substrate 10, and spacers 90 formed over the substrate 10 on both sides of the gate stack GS. The gate stack GS may further include a barrier layer 30 disposed between the gate dielectric layer 20 and the base gate electrode layer 40. The barrier layer 30 may prevent atomic diffusion between the gate dielectric layer 20 and the base gate electrode layer 40. The barrier layer 30 may include one among titanium nitride (TiN), tantalum nitride (TaN), and combinations thereof. Reference elements that are not described may be understood by referring to FIG. 1A.

Figure 1C:
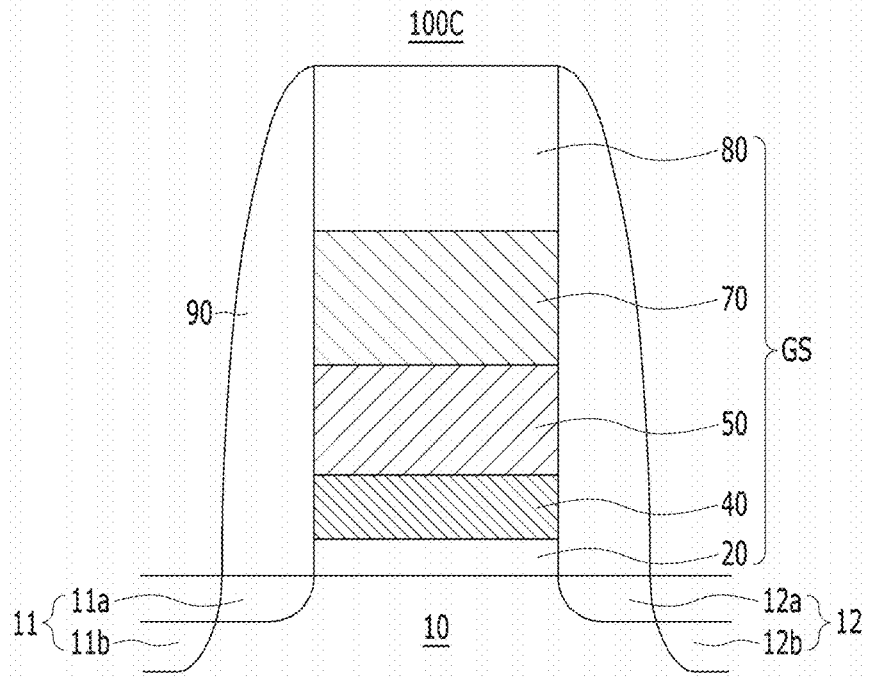

Referring to FIG. 1C, a MOS transistor 100C of a semiconductor device in accordance with an embodiment of the present disclosure may include a gate stack GS formed over a substrate 10, a first source/drain region 11 and a second source/drain region 12 formed in the substrate 10, and spacers 90 formed over the substrate 10 on both sides of the gate stack GS. The gate stack GS may include a gate dielectric layer 20, a base gate electrode layer 40, a lower gate electrode layer 50, an upper gate electrode layer 70, and a gate capping layer 80. Compared with the MOS transistor 100A of FIG. 1A, the intermediate gate electrode layer 60 may be omitted. In other words, the lower gate electrode layer 50 and the upper gate electrode layer 70 may directly contact each other. Reference elements that are not described may be understood by referring to FIGS. 1A and 1B.

Figure 1D:
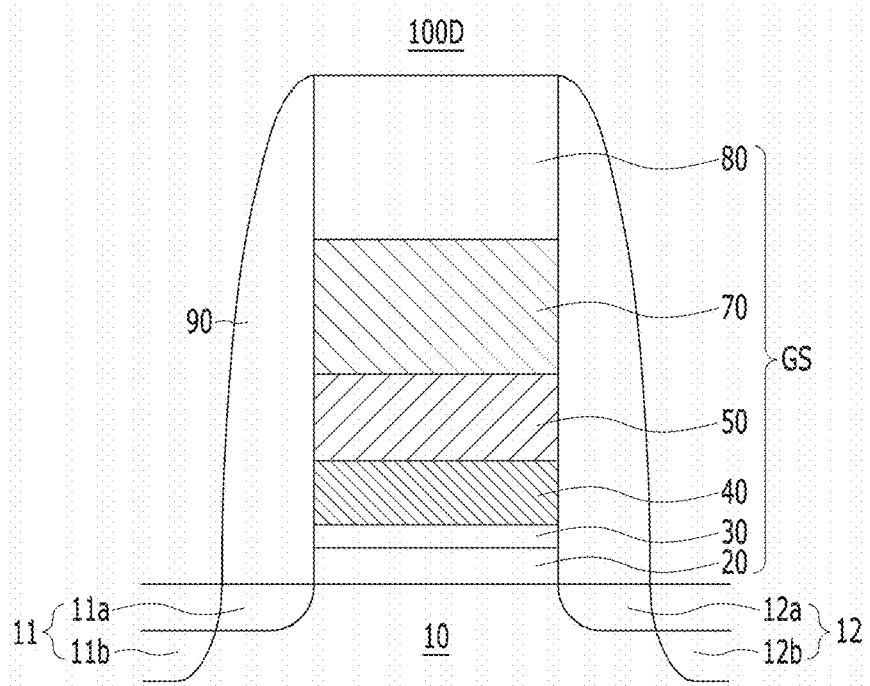

Referring to FIG. 1D, a MOS transistor 100D of the semiconductor device in accordance with an embodiment of the present disclosure may include a gate stack GS formed over a substrate 10, a first source/drain region 11 and a second source/drain region 12 formed in the substrate 10, and spacers 90 formed over the substrate 10 on both sides of the gate stack GS. The gate stack GS may include a gate dielectric layer 20, a barrier layer 30, a base gate electrode layer 40, a lower gate electrode layer 50, an upper gate electrode layer 70, and a gate capping layer 80. Compared with the MOS transistor 100A of FIG. 1A, just like the MOS transistor 100B of FIG. 1B, the barrier layer 30 disposed between the gate dielectric layer 20 and the base gate electrode layer 40 may be further included. Compared with the MOS transistor 100A of FIG. 1A, just like the MOS transistor 100C of FIG. 1C, the intermediate gate electrode layer 60 may be omitted. Reference elements that are not described may be understood by referring to FIGS. 1A to 1C.

Figure 1E:
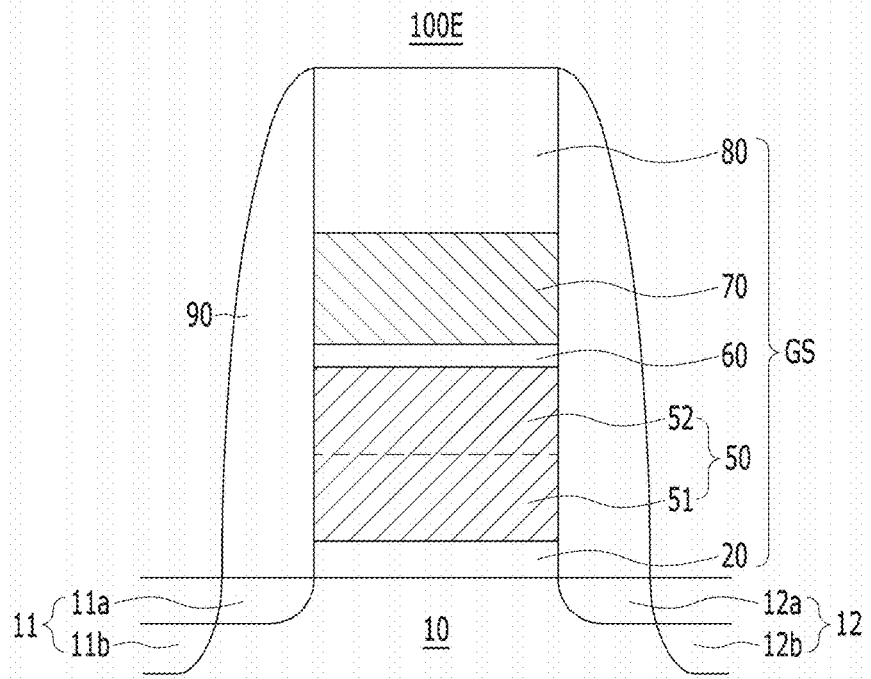

Referring to FIG. 1E, a MOS transistor 100E of the semiconductor device in accordance with an embodiment of the present disclosure may include a gate stack GS formed over a substrate 10, a first source/drain region 11 and a second source/drain region 12 formed in the substrate 10, and spacers 90 formed over the substrate 10 on both sides of the gate stack GS. The gate stack GS may include a gate dielectric layer 20, a lower gate electrode layer 50, an intermediate gate electrode layer 60, an upper gate electrode layer 70, and a gate capping layer 80. The lower gate electrode layer 50 may include a lower region 51 and an upper region 52. The lower region 51 of the lower gate electrode layer 50 may include one or more among metal compounds and alloys such as titanium nitride (TiN), tantalum nitride (TaN), titanium aluminum alloy (TiAl), titanium carbide (TiC), and tungsten nitride (WN). The upper region 52 of the lower gate electrode layer 50 may include silicide layer including at least one of titanium silicide (TiSi), aluminum silicide (AlSi), tantalum silicide (TaSi), tungsten silicide (WSi), cobalt silicide (CoSi), nickel silicide (NiSi), titanium nitride silicide (TiNSi), titanium aluminum silicide (TiAlSi), titanium carbon silicide (TiCSi), tantalum nitride silicide (TaNSi), and other metal silicides.

Figure 1F:
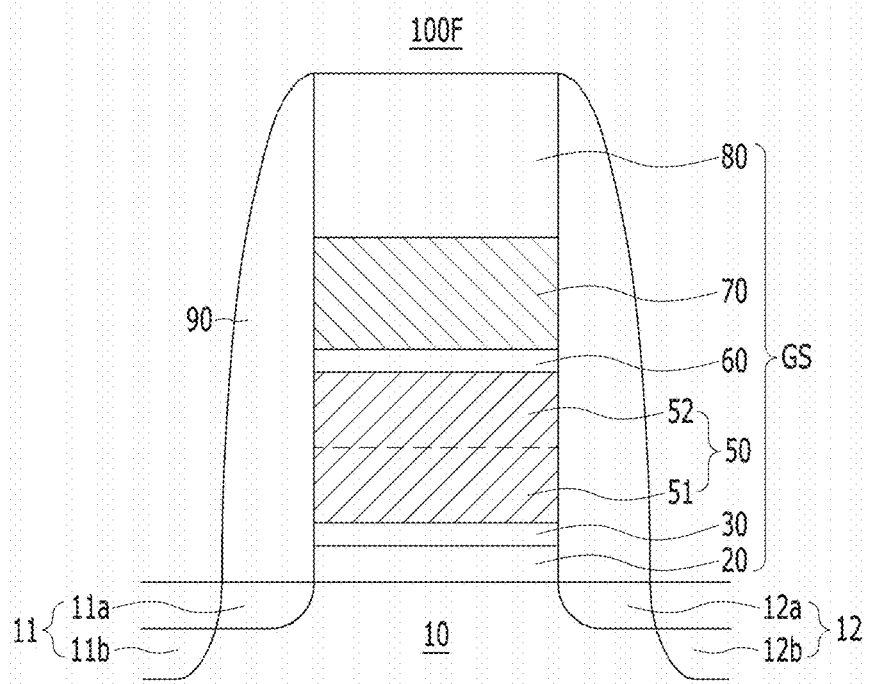

Referring to FIG. 1F, a MOS transistor 100F of the semiconductor device in accordance with an embodiment of the present disclosure may include a gate stack GS formed over a substrate 10, a first source/drain region 11 and a second source/drain region 12 formed in the substrate 10, and spacers 90 formed over the substrate 10 on both sides of the gate stack GS. The gate stack GS may include a gate dielectric layer 20, a barrier layer 30, a lower gate electrode layer 50, an intermediate gate electrode layer 60, an upper gate electrode layer 70, and a gate capping layer 80. For example, the gate stack GS may include the barrier layer 30 between the gate dielectric layer 20 and the lower gate electrode layer 50. Reference elements that are not described may be understood by referring to FIGS. 1A to 1E.

Figure 1G:
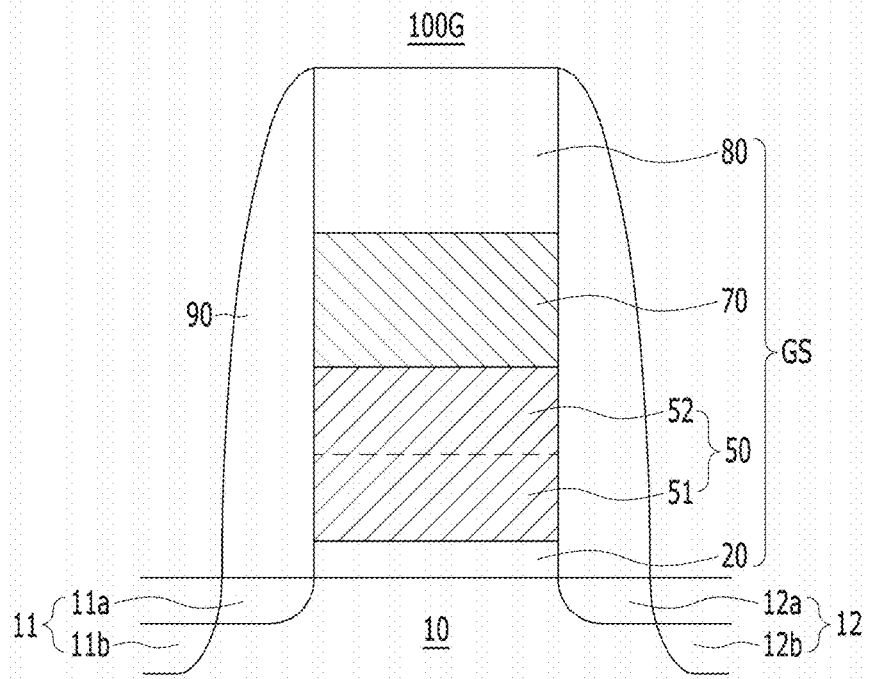

Referring to FIG. 1G, a MOS transistor 100G of the semiconductor device in accordance with an embodiment of the present disclosure may include a gate stack GS formed over a substrate 10, a first source/drain region 11 and a second source/drain region 12 formed in the substrate 10, and spacers 90 formed over the substrate 10 on both sides of the gate stack GS. The gate stack GS may include a gate dielectric layer 20, a lower gate electrode layer 50, an upper gate electrode layer 70, and a gate capping layer 80. Compared with the MOS transistor 100E of FIG. 1E, the intermediate gate electrode layer 60 may be omitted. In other words, the lower gate electrode layer 50 and the upper gate electrode layer 70 may directly contact each other. Reference elements that are not described may be understood by referring to FIGS. 1A to 1F.

Figure 1H:
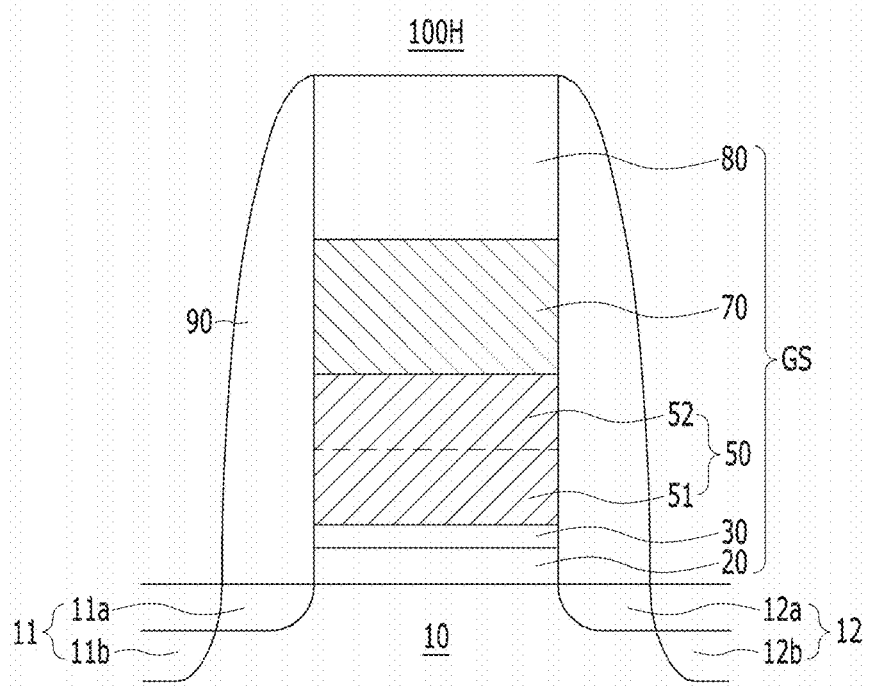

Referring to FIG. 1H, a MOS transistor 100H of the semiconductor device in accordance with an embodiment of the present disclosure may include a gate stack GS formed over a substrate 10, a first source/drain region 11 and a second source/drain region 12 formed in the substrate 10, and spacers 90 formed over the substrate 10 on both sides of the gate stack GS. The gate stack GS may include a gate dielectric layer 20, a barrier layer 30, a lower gate electrode layer 50, an upper gate electrode layer 70, and a gate capping layer 80. Compared with the MOS transistor 100E of FIG. 1E, the gate stack GS may further include the barrier layer 30 between the gate dielectric layer 20 and the lower gate electrode layer 50, and the intermediate gate electrode layer 60 may be omitted. Reference elements that are not described may be understood by referring to FIGS. 1A to 1G.

Figure 2A:
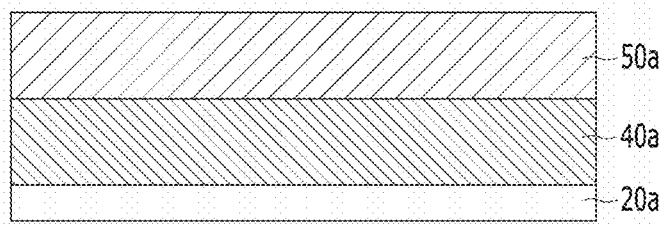
FIGS. 2A to 2J, 3, 4, 5A to 5G, 6, and 7 are longitudinal cross-sectional views illustrating a method for forming MOS transistors of a semiconductor device in accordance with an embodiment of the present disclosure.

FIGS. 2A to 2J are longitudinal cross-sectional views illustrating a method for fabricating MOS transistors of a semiconductor device in accordance with an embodiment of the present disclosure. Referring to FIG. 2A, a method for forming a MOS transistor of the semiconductor device in accordance with an embodiment of the present disclosure may include forming a gate dielectric material layer 20a, a base gate electrode material layer 40a, and a lower gate electrode material layer 50a over a substrate 10.

The substrate 10 may include a semiconductor substrate. For example, the substrate 10 may include one among monocrystalline silicon, SOI (silicon-on-insulator), an epitaxially grown silicon layer, a compound semiconductor layer, and other semiconductor material layers. According to this embodiment of the present disclosure, the substrate 10 may include a monocrystalline silicon wafer.

Forming the gate dielectric material layer 20a may include forming one among ferroelectric materials or high-k materials over the substrate 10 by performing a dielectric material deposition process. For example, the gate dielectric material layer 20a may include one among hafnium oxide (HfO), zirconium oxide (ZrO), hafnium zirconium oxide (HfZrO), hafnium silicon oxide (HfSiO), or combinations thereof. According to another embodiment of the present disclosure, the gate dielectric material layer 20a may further include one or more among aluminum (Al), yttrium (Y), lanthanum (La), gadolinium (Gd), and strontium (Sr).

Forming the base gate electrode material layer 40a may include forming one or more among metal compounds and alloys, such as a titanium nitride (TiN), tantalum nitride (TaN), titanium aluminum alloy (TiAl), titanium carbide (TiC), or tungsten nitride (WN) over the gate dielectric material layer 20a by performing a metal deposition process.

Forming the lower gate electrode material layer 50a may include forming one or more among silicidable metals and silicidable metal nitrides, such as cobalt (Co), nickel (Ni), hafnium (Hf), molybdenum (Mo), titanium (Ti), aluminum (Al), tantalum (Ta), tungsten (W), and titanium nitride (TiN), over the base gate electrode material layer 40a by performing a metal deposition process.

Figure 2B:
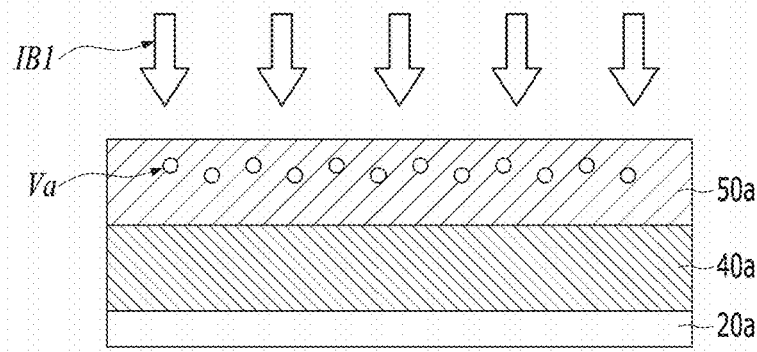

Referring to FIG. 2B, the method may include performing a preliminary ion bombardment process IB1 to form lower vacancies Va in the lower gate electrode material layer 50a. The preliminary ion bombardment process IB1 may include bombarding the upper region of the lower gate electrode material layer 50a with one or more among inert elements such as helium (He), neon (Ne), argon (Ar), xenon (Xe), krypton (Kr), and radon (Rn). The preliminary ion bombardment process IB1 may be performed through an ion implantation process or a plasma process. The lower vacancies Va may be mainly formed in the upper region of the lower gate electrode material layer 50a. The lower vacancies Va may not be formed or very few of them may be formed in the base gate electrode material layer 40a.

Figure 2C:
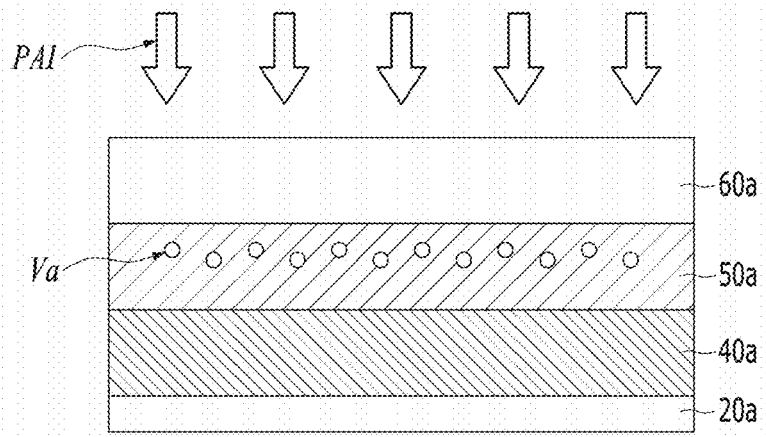

Referring to FIG. 2C, the method may include forming an intermediate gate electrode material layer 60a over the lower gate electrode material layer 50a. The intermediate gate electrode material layer 60a may include amorphous silicon. According to an embodiment of the present disclosure, forming the intermediate gate electrode material layer 60a may include forming an amorphous silicon layer or a polycrystalline silicon layer over the lower gate electrode material layer 50a and changing the polycrystalline silicon layer into an amorphous silicon layer by performing a pre-amorphization implantation (PAI) process. The pre-amorphization implantation (PAI) process may involve bombarding a polycrystalline silicon layer with one or more among inert elements such as helium (He), neon (Ne), argon (Ar), xenon (Xe), krypton (Kr), and radon (Rn). The pre-amorphization implantation (PAI) process may be performed through an ion-implant process or a plasma process. According to another embodiment of the present disclosure, the pre-amorphization implantation (PAI) process may include bombarding the intermediate gate electrode material layer 60a with one or more among N-type ions, such as arsenic (As), antimony (Sb) and phosphorus (P), and P-type ions, such as boron (B), boron fluoride ($BF_2$), gallium (Ga) and indium (In), in a sufficient dose to implant them into the intermediate gate electrode material layer 60a. According to another embodiment of the present disclosure, a deposition process and an ion implantation process may be performed simultaneously. According to yet another embodiment of the present disclosure, the ion implantation process may be performed in-situ following the deposition process. Accordingly, the intermediate gate electrode material layer 60a may have conductivity.

Since the intermediate gate electrode material layer 60a is amorphized by the pre-amorphization implantation (PAI) process, the diffusion coefficient of silicon atoms may be greater than that of polycrystalline silicon. For example, the silicon atoms in the amorphized intermediate gate electrode material layer 60a may have high diffusivity at a relatively low temperature and may have higher diffusivity than the silicon atoms of the polycrystalline silicon layer. The lower vacancies Va may be distributed close to the interface between the lower gate electrode material layer 50a and the intermediate gate electrode material layer 60a.

Figure 2D:
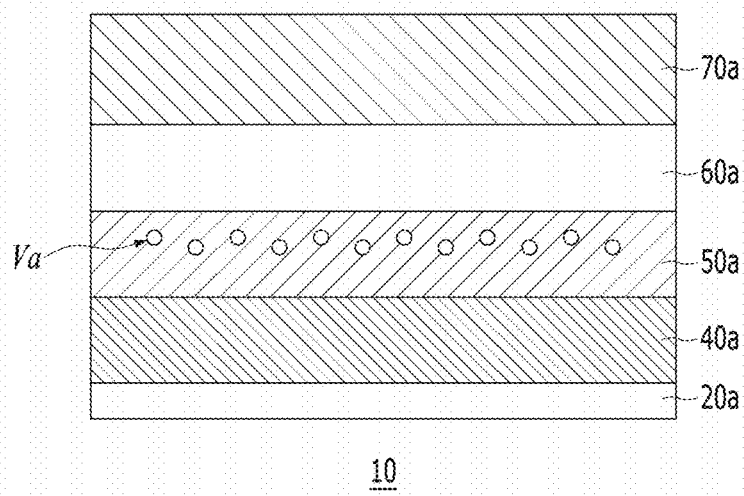

Referring to FIG. 2D, the method may include forming an upper gate electrode material layer 70a over an intermediate gate electrode material layer 60a. Forming the upper gate electrode material layer 70a may include performing a metal deposition process to form one or more among silicidable metals and silicidable metal compounds, such as cobalt (Co), nickel (Ni), hafnium (Hf), molybdenum (Mo), titanium (Ti), aluminum (Al), tantalum (Ta), tungsten (W), and titanium nitride (TiN).

Figure 2E:
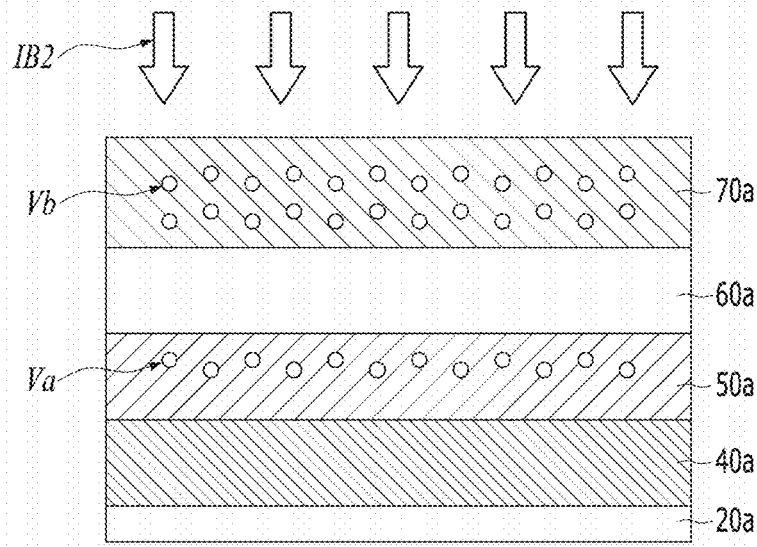

Referring to FIG. 2E, the method may include performing a main ion bombardment process (IB2) to form upper vacancies Vb in the upper gate electrode material layer 70a. The main ion bombardment process (IB2) may include bombarding the upper gate electrode material layer 70a with one or more among inert elements, such as helium (He), neon (Ne), argon (Ar), xenon (Xe), krypton (Kr), and radon (Rn). The upper vacancies Vb may be formed in the entire upper gate electrode material layer 70a by the main ion bombardment process IB2. The main ion bombardment process (IB2) may be performed through an ion implantation process or a plasma process.

According to another embodiment of the present disclosure, the preliminary ion bombardment process described with reference to FIG. 2B may be omitted. For example, the main ion bombardment process IB2 may further include implanting ions into the lower gate electrode material layer 50a through the upper gate electrode material layer 70a and the intermediate gate electrode material layer 60a. In other words, the lower vacancies Va and the upper vacancies Vb may be simultaneously formed in the lower gate electrode material layer 50a and the upper gate electrode material layer 70a, respectively, by the main ion bombardment process (IB2), and the amorphization of the intermediate gate electrode material layer 60a may be accelerated.

Figure 2F:
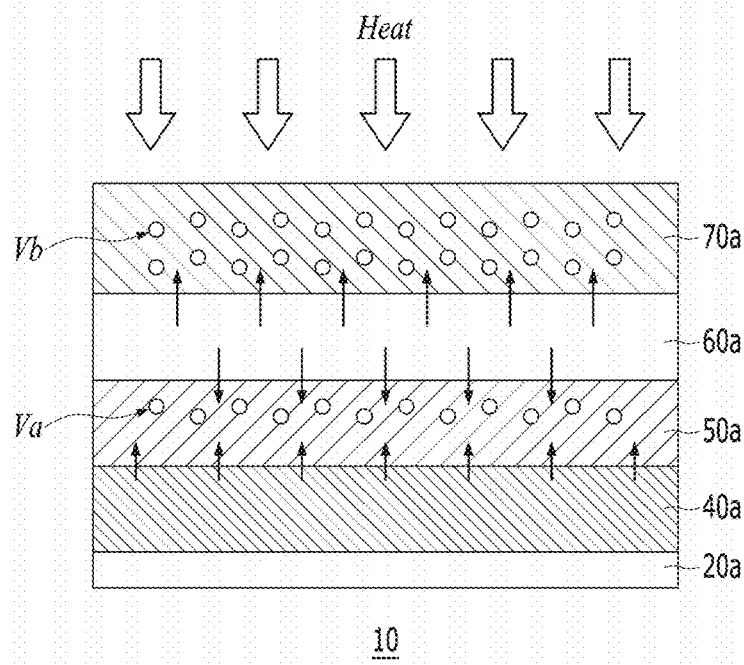

Referring to FIG. 2F, the method may include silicidizing the lower gate electrode material layer 50a and the upper gate electrode material layer 70a by performing a silicidation process. For example, silicide layers may be formed in the lower gate electrode material layer 50a and the upper gate electrode material layer 70a. The silicidation process may include heating the substrate 10, the gate dielectric material layer 20a, the base gate electrode material layer 40a, the lower gate electrode material layer 50a, the intermediate gate electrode material layer 60a, and the upper gate electrode material layer 70a at approximately 600 to 900° C.

In the silicidation process, silicon atoms in the intermediate gate electrode material layer 60a may diffuse into the lower gate electrode material layer 50a and the upper gate electrode material layer 70a (refer to long arrows). The lower vacancies Va in the lower gate electrode material layer 50a and the upper vacancies Vb in the upper gate electrode material layer 70a may accelerate the diffusion of the silicon atoms in the intermediate gate electrode material layer 60a.

Metal atoms in the base gate electrode material layer 40a may also diffuse toward the lower gate electrode material layer 50a and the intermediate gate electrode material layer 60a (refer to short arrows). However, since the lower vacancies Va are partially distributed only in the upper region of the lower gate electrode material layer 50a close to the intermediate gate electrode material layer 60a, the diffusion coefficient of the metal atoms in the base gate electrode material layer 40a may be smaller than the diffusion coefficient of the metal atoms in the lower gate electrode material layer 50a.

Since the base gate electrode material layer 40a includes metal, the volume of the base gate electrode material layer 40a may increase during a silicidation process and other thermal treatment processes. The volume of the stack of the lower gate electrode material layer 50a, the intermediate gate electrode material layer 60a, and the upper gate electrode material layer 70a may decrease in a silicidation process or other thermal treatment processes. In other words, the stack of the lower gate electrode material layer 50a, the intermediate gate electrode material layer 60a, and the upper gate electrode material layer 70a may compensate for and alleviate the volume expansion of the base gate electrode material layer 40a.

When the volume of the base gate electrode material layer 40a is excessively expanded, a compressive stress may be applied to the gate dielectric material layer 20a. This compressive stress may cause a phase change of the gate dielectric material layer 20a. According to the embodiment of the present disclosure, since the volume of the stack of the lower gate electrode material layer 50a, the intermediate gate electrode material layer 60a, and the upper gate electrode material layer 70a decreases, a tensile stress may be caused. Accordingly, the tensile stress of the stack of the lower gate electrode material layer 50a, the intermediate gate electrode material layer 60a, and the upper gate electrode material layer 70a may compensate for and alleviate the compressive stress of the base gate electrode material layer 40a.

Since the upper gate electrode material layer 70a includes the upper vacancies Vb that are distributed throughout the gate electrode material layer 70a, it may be silicidized faster than the lower gate electrode material layer 50a and may have a high silicidation efficiency. In other words, the upper gate electrode material layer 70a may accelerate the volume reduction of the intermediate gate electrode material layer 60a more than the volume reduction of the lower gate electrode material layer 50a.

According to the embodiment of the present disclosure, since the lower vacancies Va in the lower gate electrode material layer 50a are mainly formed in the upper region of the lower gate electrode material layer 50a, diffusion of the silicon atoms of the intermediate gate electrode material layer 60a into the base gate electrode material layer 40a may be alleviated or prevented. When the silicon atoms of the intermediate gate electrode material layer 60a diffuse into the base gate electrode material layer 40a (for example, when the base gate electrode material layer 40a is silicidized), the electrical resistance of the base gate electrode material layer 40a may become significantly higher. Also, the work function of the base gate electrode material layer 40a may change. Therefore, to obtain a low resistance and a high conductivity of the base gate electrode material layer 40a, it may be preferable to form the lower vacancies Va mainly in the upper region of the lower gate electrode material layer 50a.

Figure 2G:
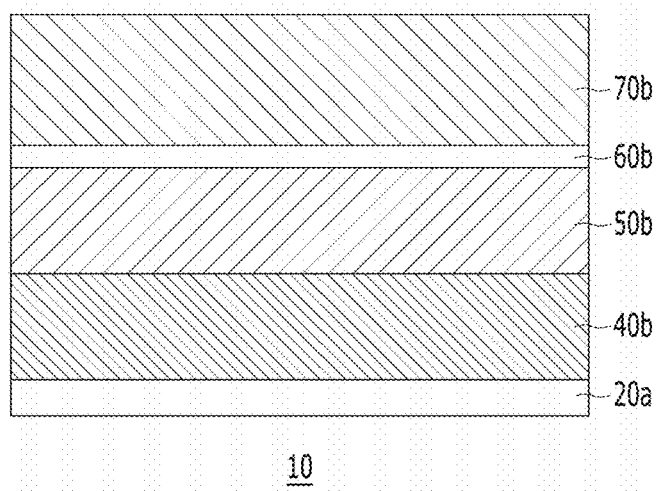

Referring to FIG. 2G, as a result of the silicidation process, a stack of a base gate electrode material layer 40b which is expanded (thickened) to have an increased volume, a lower gate electrode material layer 50b which is reduced (thinned) to have a decreased volume, an intermediate gate electrode material layer 60b, and an upper gate electrode material layer 70b may be formed. The lower gate electrode material layer 50b and the upper gate electrode material layer 70b may include silicide layers, respectively.

Figure 2H:
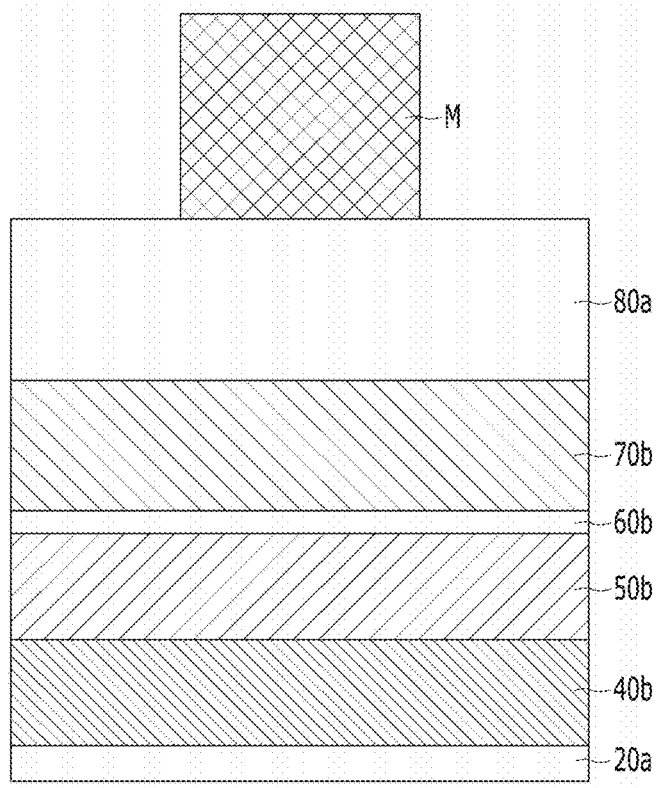

Referring to FIG. 2H, the method may include forming a gate capping material layer 80a over the upper gate electrode material layer 70b and forming a mask pattern M over the gate capping material layer 80a. The gate capping material layer 80a may include a dielectric material, such as silicon nitride, and the mask pattern M may include a photoresist.

Figure 2I:
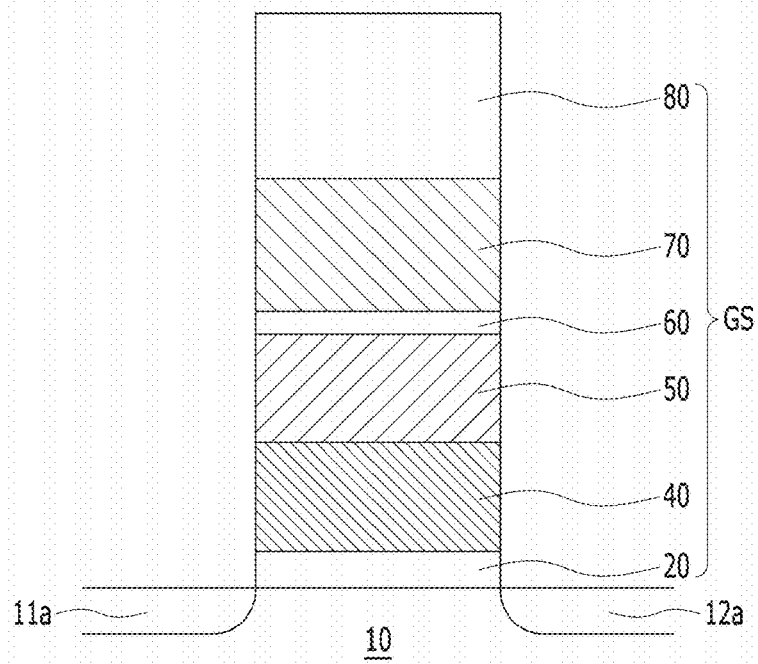

Referring to FIG. 2I, the method may include forming a gate stack GS by performing an etching process with the mask pattern M used as an etch mask and patterning the gate capping material layer 80a, the upper gate electrode material layer 70b, the intermediate gate electrode material layer 60b, the lower gate electrode material layer 50b, the base gate electrode material layer 40b, and the gate dielectric material layer 20a. The gate stack GS may include a gate dielectric layer 20, a base gate electrode layer 40, a lower gate electrode layer 50, an intermediate gate electrode layer 60, an upper gate electrode layer 70, and a gate capping layer 80. Subsequently, the mask pattern M may be removed.

The method may include performing a first ion implantation process using the mask pattern M or the gate capping layer 80 as an ion implantation mask to form a first shallow source/drain region 11a and a second shallow source/drain region 12a in a substrate 10. The first shallow source/drain region 11a and the second shallow source/drain region 12a may include one or more among phosphorus (P), arsenic (A), antimony (Sb), boron (B), gallium (Ga), and indium (In).

Figure 2J:
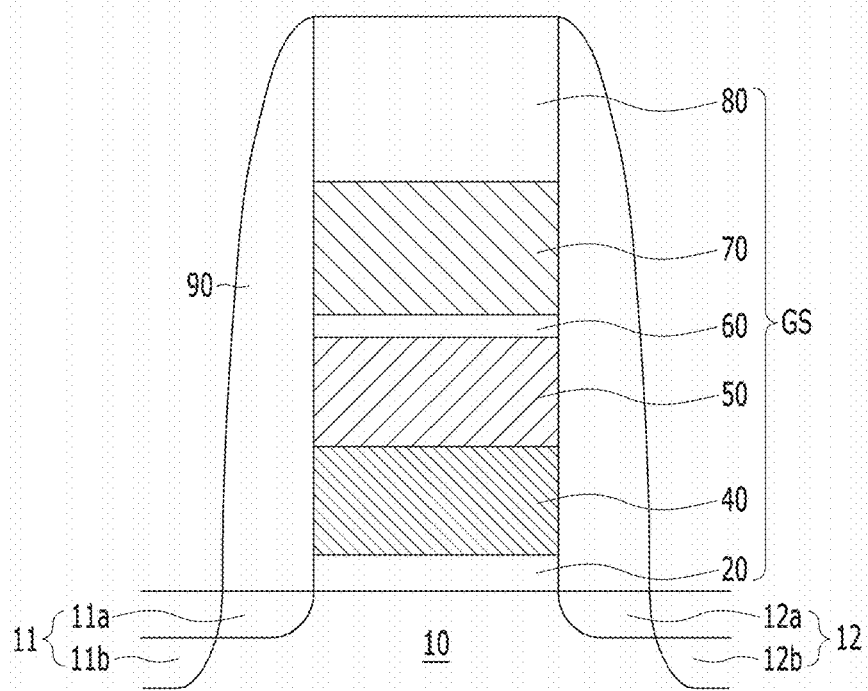

Referring to FIG. 2J, the method may include forming spacers 90 on both sides of the gate stack GS, and forming a first deep source/drain region 11b and a second deep source/drain region 12b in the substrate 10 by performing a second ion implantation process using the gate capping layer 80 and the spacers 90 as an ion implantation mask. The first deep source/drain region 11b and the second deep source/drain region 12b may have a greater depth than the first shallow source/drain region 11a and the second shallow source/drain region 12a. A first source/drain region 11 including the first shallow source/drain region 11a and the first deep source/drain region 11b that are overlapping with each other and a second source/drain region 12 including the second shallow source/drain region 12a and the second deep source/drain regions 12b that are overlapping with each other may be formed.

Figure 3:
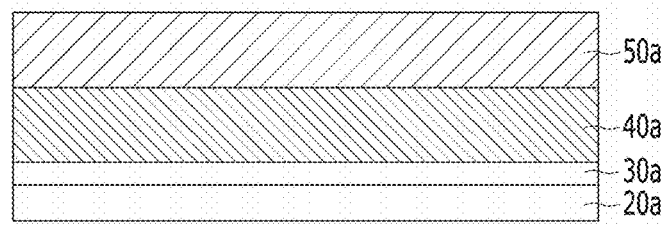

FIG. 3 is a longitudinal cross-sectional view illustrating a method for forming a MOS transistor of a semiconductor device in accordance with an embodiment of the present disclosure. Referring to FIG. 3, the method for forming a MOS transistor of a semiconductor device in accordance with the embodiment of the present disclosure may include forming a gate dielectric material layer 20a, a barrier material layer 30a, a base gate electrode material layer 40a, and a lower gate electrode material layer 50a over a substrate 10. Compared with FIG. 2A, the method may further include forming a barrier material layer 30a between the gate dielectric material layer 20a and the base gate electrode material layer 40a. The barrier material layer 30a may include one among titanium nitride (TiN), tantalum nitride (TaN), and combinations thereof. According to the embodiment of the present disclosure, the base gate electrode material layer 40a may include a metal, such as tungsten (W). Subsequently, the method may further include forming a MOS transistor shown in FIG. 1B by performing the processes described with reference to FIGS. 2B to 2J.

Figure 4:
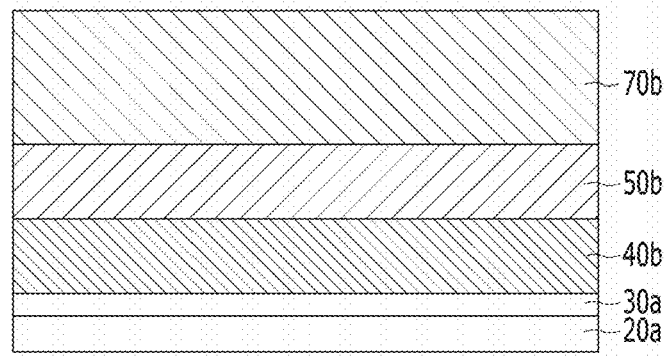

FIG. 4 is a longitudinal cross-sectional view illustrating a method for forming a MOS transistor of a semiconductor device in accordance with an embodiment of the present disclosure. Referring to FIG. 4, the method for forming a MOS transistor of a semiconductor device in accordance with the embodiment of the present disclosure may include performing the processes described with reference to FIGS. 2A to 2F, and the intermediate gate electrode material layer 60a may disappear completely. In other words, a silicidation process may be sufficiently performed so that all the silicon atoms in the intermediate gate electrode material layer 60a may diffuse into the lower gate electrode material layer 50a and the upper gate electrode material layer 70a. Accordingly, the expanded lower gate electrode material layer 50b and the expanded upper gate electrode material layer 70b may directly contact each other. Subsequently, the method may include forming the MOS transistor illustrated in FIG. 1C by further performing the processes described with reference to FIGS. 2H to 2J.

Figure 5A:
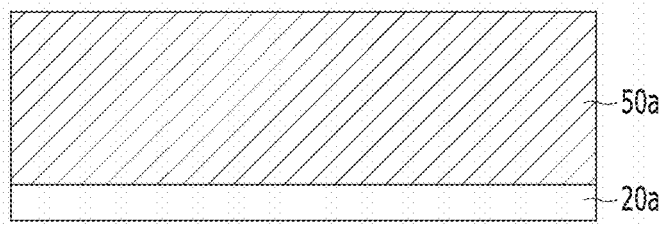

FIGS. 5A to 5G are longitudinal cross-sectional views illustrating a method for forming a MOS transistor of a semiconductor device in accordance with an embodiment of the present disclosure. Referring to FIG. 5A, the method for forming a MOS transistor of a semiconductor device in accordance with the embodiment of the present disclosure may include forming a lower gate dielectric layer 50a over a substrate 10 by performing a metal deposition process. The lower gate dielectric layer 50a may include one or more among metal compounds or alloys, such as titanium nitride (TiN), tantalum nitride (TaN), titanium aluminum alloy (TiAl), titanium carbide (TiC), or tungsten nitride (WN).

According to another embodiment of the present disclosure, the lower gate dielectric layer 50*a* may include one or more among silicidable metals and silicidable metal nitrides, such as cobalt (Co), nickel (Ni), hafnium (Hf), molybdenum (Mo), titanium (Ti), aluminum (Al), tantalum (Ta) and tungsten (W), and titanium nitride (TiN).

Figure 5B:
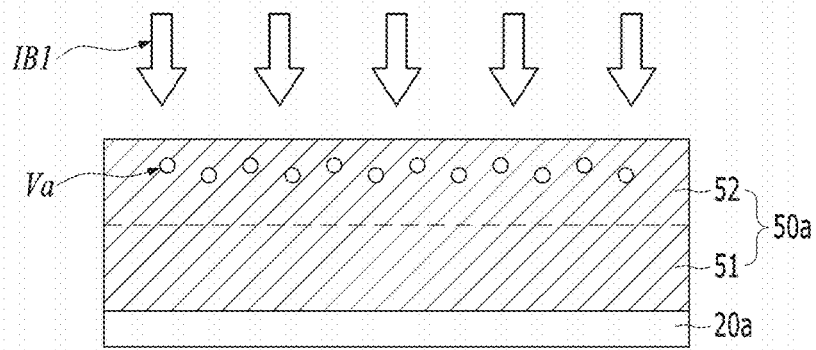

Referring to FIG. 5B, the method may include performing a preliminary ion bombardment process (IB1) to form lower vacancies Va in the lower gate electrode material layer 50*a*. The lower vacancies Va may be mainly formed in the upper region 52 of the lower gate electrode material layer 50*a*. In the lower region 51 of the lower gate electrode material layer 50*a*, the lower vacancies Va may not be formed or may be formed very few.

Figure 5C:
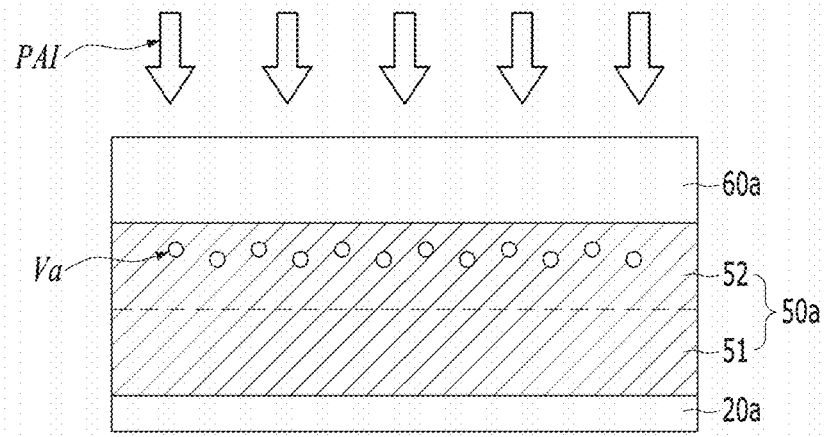

Referring to FIG. 5C, the method may include forming an intermediate gate electrode material layer 60*a* over the lower gate electrode material layer 50*a*. According to an embodiment of the present disclosure, the intermediate gate electrode material layer 60*a* is formed by forming a polycrystalline silicon layer over the lower gate electrode material layer 50*a* and changing the polycrystalline silicon layer into an amorphous silicon layer by performing a pre-amorphization implantation (PAI) process.

Figure 5D:
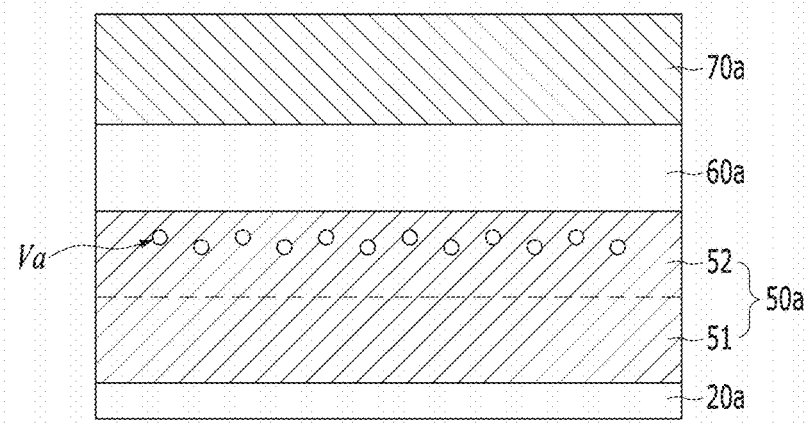

Referring to FIG. 5D, the method may include forming an upper gate electrode material layer 70*a* over the intermediate gate electrode material layer 60*a*.

Figure 5E:
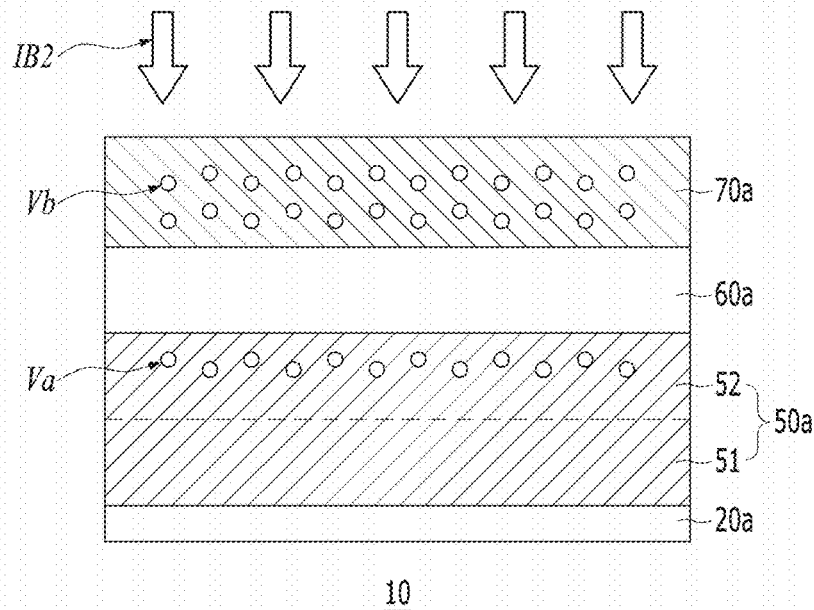

Referring to FIG. 5E, the method may include forming upper vacancies Vb in the upper gate electrode material layer 70*a* by performing a main ion bombardment process (IB2). According to another embodiment of the present disclosure, the preliminary ion bombardment process described with reference to FIG. 5B may be omitted. For example, the main ion bombardment process IB2 may further include implanting ions into the upper region 52 of the lower gate electrode material layer 50*a* through the upper gate electrode material layer 70*a* and the intermediate gate electrode material layer 60*a*. In other words, the lower vacancies Va and the upper vacancies Vb may be simultaneously formed in the upper region 52 of the lower gate electrode material layer 50*a* and the upper gate electrode material layer 70*a* by the main ion bombardment process (IB2), respectively, and the amorphization of the intermediate gate electrode material layer 60*a* may be accelerated.

Figure 5F:
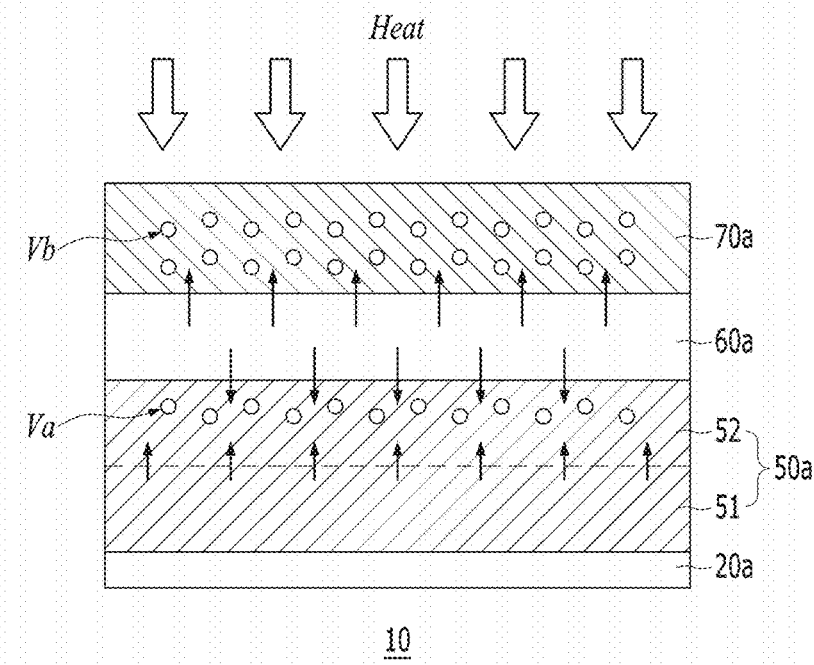

Referring to FIG. 5F, the method may include silicidizing the lower gate electrode material layer 50*a* and the upper gate electrode material layer 70*a* by performing a silicidation process. The silicidation process may include heating the substrate 10, the gate dielectric material layer 20*a*, the lower gate electrode material layer 50*a*, the intermediate gate electrode material layer 60*a*, and the upper gate electrode material layer 70*a* at approximately 600 to 900° C. Since the lower gate electrode material layer 50*a* contains metal, the volume of the lower gate electrode material layer 50*a* may increase in a silicide process and other heat treatment processes. The volume of the stack of the upper region 52 of the lower gate electrode material layer 50*a*, the intermediate gate electrode material layer 60*a*, and the upper gate electrode material layer 70*a* may be reduced in the silicide process or other thermal treatment processes. In other words, the stack of the upper region 52 of the lower gate electrode material layer 50*a*, the intermediate gate electrode material layer 60*a*, and the upper gate electrode material layer 70*a* may compensate for and alleviate the volume expansion of the lower region 51 of the lower gate electrode material layer 50*a*.

Figure 5G:
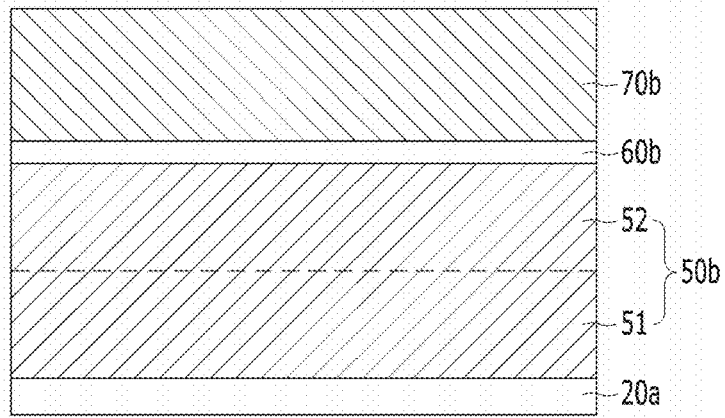

Referring to FIG. 5G, as a result of the silicidation process, a stack of the lower gate electrode material layer 50*b* which is expanded (thickened) to have an increased volume, the intermediate gate electrode material layer 60*b* which is reduced (thinned) to have a decreased volume, and the upper gate electrode material layer 70*b* may be formed. The lower region 51 of the lower gate electrode material layer 50*b* may be expanded, and the upper region 52 of the lower gate electrode material layer 50*b* may be reduced.

Subsequently, the method may further include forming the MOS transistor shown in FIG. 1E by performing the processes described with reference to FIGS. 2H to 2J.

Figure 6:
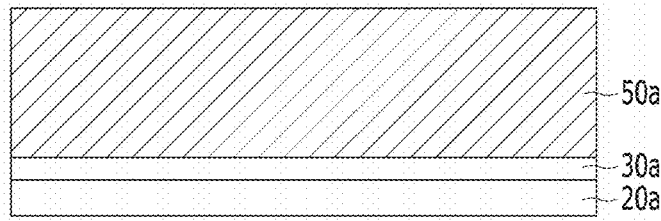

FIG. 6 is a longitudinal cross-sectional view illustrating a method for forming a MOS transistor of a semiconductor device in accordance with an embodiment of the present disclosure. Referring to FIG. 6, the method for forming a MOS transistor of a semiconductor device in accordance with the embodiment of the present disclosure may include forming a gate dielectric material layer 20*a*, a barrier material layer 30*a*, and a lower gate electrode material layer 50*a* over a substrate 10. Compared with FIG. 5A, the method may further include forming the barrier material layer 30*a* between the gate dielectric material layer 20*a* and the lower gate electrode material layer 50*a*. The barrier material layer 30*a* may include one among titanium nitride (TiN), tantalum nitride (TaN), and combinations thereof. Subsequently, the method may further include forming the MOS transistor shown in FIG. 1F by performing the processes described with reference to FIGS. 5B to 5G and 2H to 2J.

Figure 7:
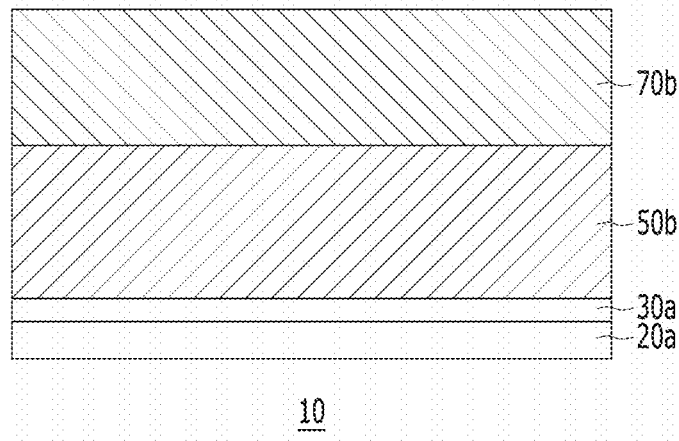

FIG. 7 is a longitudinal cross-sectional view illustrating a method for forming a MOS transistor of a semiconductor device in accordance with an embodiment of the present disclosure. Referring to FIG. 7, the method may include performing the processes described with reference to FIGS. 5A to 5F, and the intermediate gate electrode material layer 60*a* may completely disappear. In other words, the silicidation process may be sufficiently performed so that all the silicon atoms in the intermediate gate electrode material layer 60*a* may diffuse into the lower gate electrode material layer 50*a* and the upper gate electrode material layer 70*a*. Accordingly, the expanded lower gate electrode material layer 50*b* and the expanded upper gate electrode material layer 70*b* may directly contact each other. Subsequently, the method may include forming the MOS transistor illustrated in FIG. 1G by further performing the processes described with reference to FIGS. 2H to 2J to.

According to the embodiments of the present disclosure, in the process of forming a MOS transistor, compressive stress applied to a gate dielectric layer may be relieved. Accordingly, the performance of the MOS transistor is not deteriorated.

Other effects of the diverse embodiments of the present disclosure that are not described herein may be understood from the detailed description of the present disclosure.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a gate stack disposed over a substrate;
   gate spacers each disposed on sides of the gate stack; and
   source/drain regions each formed in the substrate to be vertically aligned with the gate spacers,
   wherein the gate stack comprises:
   a gate dielectric layer;
   a lower gate electrode layer over the gate dielectric layer;

an upper gate electrode layer over the lower gate electrode layer; and a gate capping layer over the upper gate electrode layer, wherein:

the lower gate electrode layer includes a first lower silicide region and a first upper silicide region, the upper gate electrode layer includes a second lower silicide region and a second silicide region, the first lower silicide region of the lower gate electrode layer is metal-richer than the first upper silicide region of the lower gate electrode layer, and the first upper silicide region of the lower gate electrode layer is silicon-richer than the first lower silicide region of the lower gate electrode layer.

2. The semiconductor device according to claim 1, wherein:

the second lower silicide region of the upper gate electrode layer is silicon-richer than the second upper silicide region of the upper gate electrode layer, the second upper silicide region of the upper gate electrode layer is metal-richer than the second lower silicide region of the upper gate electrode layer.

3. The semiconductor device according to claim 2, wherein:

each of the first lower silicide region of the lower gate electrode layer and the second upper silicide region of the upper gate electrode layer includes at least one of a titanium nitride layer, a tantalum nitride layer, a titanium aluminum alloy layer, a titanium carbide layer, or a tungsten nitride layer, and each of the first upper silicide region of the lower gate electrode layer and the second lower silicide region of the upper gate electrode layer includes at least one of a titanium nitride layer, a tantalum nitride layer, a titanium aluminum alloy layer, a titanium carbide layer, or a tungsten nitride layer.

4. The semiconductor device according to claim 1, further comprising:

an intermediate gate electrode layer between the lower gate electrode layer and the upper gate electrode layer, wherein the intermediate gate electrode layer includes a poly-silicon layer.

5. The semiconductor device according to claim 4, wherein the intermediate gate electrode layer further includes at least one of arsenic ions, antimony ions, phosphorus ions, boron ions, gallium ions, or indium ions.

6. The semiconductor device according to claim 1, further comprising:

a base gate electrode layer between the gate dielectric layer and the lower gate electrode layer, wherein the base gate electrode layer includes at least one of a titanium nitride layer, a tantalum nitride layer, a titanium aluminum alloy layer, a titanium carbide layer, or a tungsten nitride layer.

7. A semiconductor device comprising:
a substrate; and
a gate stack over the substrate,
wherein the gate stack comprises:
a gate dielectric layer;
a barrier layer over the gate dielectric layer;
a lower gate electrode layer over the barrier layer;
an intermediate gate electrode layer over the lower gate electrode layer; and
an upper gate electrode layer over the intermediate gate electrode layer, wherein: the barrier layer includes at least one of titanium nitride, tantalum nitride or a combination thereof, a lower region of the lower gate electrode layer includes a metal region, an upper region of the lower gate electrode layer includes a metal silicide region, and the intermediate gate electrode layer includes a poly-silicon layer.

8. The semiconductor device according to claim 7, wherein:

the gate stack further comprises a gate capping layer over the upper gate electrode layer, and the gate capping layer includes silicon nitride.

9. The semiconductor device according to claim 7, wherein the gate dielectric layer includes at least one of hafnium oxide, zirconium oxide, hafnium zirconium oxide, or a combination thereof.

10. The semiconductor device according to claim 7, wherein the intermediate gate electrode layer further includes at least one of arsenic, antimony, phosphorus, boron, gallium, or indium.

11. The semiconductor device according to claim 7, further comprising:

gate spacers disposed on side surfaces of the gate stack; and a first source/drain region and a second source/drain region formed in the substrate, wherein the first source/drain region includes:
a first shallow source/drain region vertically aligned with a first side of the gate stack; and
a first deep source/drain region vertically aligned with one of the spacers, wherein the second source/drain region includes:
a second shallow source/drain region vertically aligned with a second side of the gate stack; and
a second deep source/drain region vertically aligned with other one of the spacers, wherein the first shallow source/drain region partially overlaps with the first deep source/drain region, and wherein the second shallow source/drain region partially overlaps with the second deep source/drain region.

12. The semiconductor device according to claim 7, wherein the gate stack further comprises a base gate electrode layer between the barrier layer and the lower gate electrode layer, wherein the base gate electrode layer comprises at least one of titanium nitride, tantalum nitride, titanium aluminum alloy, or titanium carbide.

13. The semiconductor device according to claim 7, wherein:

a lower region of the upper gate electrode layer includes a metal silicide region, and a lower region of the upper gate electrode layer includes a metal region.

14. A semiconductor device comprising:
a gate stack over a substrate; and
gate spacers disposed on sides of the gate stack,
wherein the gate stack comprises:
a gate dielectric layer;
a lower gate electrode layer over the gate dielectric layer;
an upper gate electrode layer over the lower gate electrode layer; and
a gate capping layer over the upper gate electrode layer, wherein:

the lower gate electrode layer includes a first lower silicide region and a first upper silicide region, the upper gate electrode layer includes a second lower silicide region and a second silicide region, the second lower silicide region of the upper gate electrode layer is silicon-richer than the second upper silicide region of the upper gate electrode layer, and the second upper silicide region of the upper gate electrode layer is metal-richer than the second lower silicide region of the upper gate electrode layer.

15. The semiconductor device according to claim 14, wherein:

the first lower silicide region of the lower gate electrode layer is metal-richer than the first upper silicide region of the lower gate electrode layer, and the first upper silicide region of the lower gate electrode layer is silicon-richer than the first lower silicide region of the lower gate electrode layer.

* * * * *